(12) United States Patent
Damgaard et al.

(10) Patent No.: US 6,208,875 B1
(45) Date of Patent: Mar. 27, 2001

(54) RF ARCHITECTURE FOR CELLULAR DUAL-BAND TELEPHONES

(75) Inventors: Morten Damgaard, Laguna Hills; Leo Li, Trabuco Canyon, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/057,124

(22) Filed: Apr. 8, 1998

(51) Int. Cl.[7] .................................................. H04B 1/40
(52) U.S. Cl. ..................... 455/552; 455/553; 455/260; 455/76; 455/86
(58) Field of Search .................. 455/76, 78, 86, 455/85, 84, 83, 88, 552, 553, 260, 180.3, 189.1

(56) References Cited

U.S. PATENT DOCUMENTS

| | | | |
|---|---|---|---|
| 5,437,051 | * | 7/1995 | Oto ...................................... 455/189.1 |
| 5,511,236 | * | 4/1996 | Umstattd et al. ....................... 455/76 |
| 5,535,432 | * | 7/1996 | Dent ....................................... 455/77 |
| 5,564,076 | * | 10/1996 | Auvray ................................... 455/76 |
| 5,740,521 | * | 4/1998 | Hulkko et al. ......................... 455/76 |
| 5,890,051 | * | 3/1999 | Schlang et al. ........................ 455/76 |
| 5,983,081 | * | 11/1999 | Lehtinen ................................ 455/76 |

FOREIGN PATENT DOCUMENTS

| | | | |
|---|---|---|---|
| 0581573 A1 | * | 2/1994 | (EP) ............................... H04B/1/40 |
| 0 653 851 A2 | | 5/1995 | (EP) . |
| 0 678 974 A2 | | 10/1995 | (EP) . |
| 0678974 A2 | * | 10/1995 | (EP) ............................... H03D/7/16 |

| | | |
|---|---|---|
| WO 97/30523 | 8/1997 | (WO) . |

OTHER PUBLICATIONS

Article entitled, "Complete GSM Dual Band System Solution," by Siemens AG, distributed in Germany in Mar., 1998.

* cited by examiner

*Primary Examiner*—Reinhard Eisenzopf
*Assistant Examiner*—Duc Nguyen
(74) *Attorney, Agent, or Firm*—Thomas, Kayden, Horstemeyer & Risley LLP

(57) ABSTRACT

A dual band RF architecture including a GSM quadrature modulator for modulating an intermediate frequency (IF) wherein the frequency of the modulated IF signal is changed such that one IF is used for the GSM band and another IF is used for the DCS 1800 band. An intermediate frequency (IF) filter with a pass band that covers both the GSM IF and the DCS 1800 IF is connected to the output of the modulator and outputs to a transmit phase lock loop, which translates the IF signal from the IF filter to either a DCS 1800 band radio frequency signal or a GSM band radio frequency signal, depending on the frequency of a local oscillator (LO). The receiver employs a down converter which provides a down converted output signal selected by high side injection for the GSM band an by low side injection for the DCS 1800 band. The down converter outputs to an intermediate frequency (IF) receiver filter centered at 400 MHz designed to pass either the down converted GSM signal or the down converted DCS signal to demodulation circuitry. A single phase lock loop circuit is used to supply, on a single output, the LO signal for down converting either the GSM receive band or the DCS 1800 receive band, as well as the LO for the transmit phase lock loop.

19 Claims, 4 Drawing Sheets

RF ARCHITECTURE FOR CELLULAR DUAL-BAND TELEPHONES

BACKGROUND OF THE INVENTION

1. Field of the Invention

The subject invention relates to RF (radio frequency) systems and more particularly to an RF architecture for a dual band cellular telephone.

2. Description of Related Art

Mobile phones have recently gained widespread use throughout the world. Mobile phones communicate with a base station serving a predetermined area or cell of a cellular network system, such as GSM. Each base station has a limited bandwidth within which to operate, depending upon the particular transmission technique utilized by the base station. This limited bandwidth is separated into a plurality of channels, which are frequency-spaced evenly from one another, and these plurality of channels are used by the mobile phones within that base station's transmission area. As a result, each base station can only handle a limited number of phones. The number of possible phones is equal to the number of channels and time-slots on those channels available at the base station. Therefore, the frequency spacing between channels is minimized in order to maximize the number of channels supported by the operating bandwidth of the base stations.

The capacity of base stations in highly populated areas can become saturated during time periods of high use. Mobile phones currently operate as single band phones, where the transmitted signal frequency is within the bandwidth of a base station operating on the same transmission method as the mobile phone. Thus, there is a need for mobile phones to operate with dual band transmissions to increase system capacity, so that the system could select between two transmission frequency bands depending upon which bandwidth is less saturated and could provide a better signal quality.

Typically, in a conventional single band cellular phone, data to be transmitted by the telephone handset is fed to a transmitter including a differential encoder, where an in-phase component (I) and a quadrature component (Q) of the signal to be transmitted are created. The I and Q components are then passed through digital filters which give the modulation a particular shape. The resultant I and Q filtered signals are then modulated at a radio frequency for transmission and combined as a phase modulated signal. The phase modulated signal is then amplified to bring the signal to a desired power level for transmission. Digital modulators, such as a Gaussian minimum shift keying (GMSK) modulator, are typically used in digital wireless phones.

Most mobile phones are designed to be lightweight and portable, so that they may be easily carried on the person using the mobile phone, such as in their pocket or purse. It is therefore critical to design a mobile phone to be as small as possible, thus requiring the number of components to be minimized. With respect to design of a dual band mobile phone, these considerations present serious design problems, for example, because the use of two entirely separate transmitter and receiver circuits for the respective bands would result in a prohibitively large and complex phone. Additional problems confront implementation of a dual band phone arising from the potential for generation of unwanted frequency components.

OBJECTS AND SUMMARY OF THE INVENTION

It is therefore an object of the present invention to improve mobile phone systems;

It is another object of the invention to provide a dual band RF transmitter/receiver architecture;

It is a further object to improve RF architecture of mobile phone systems;

It is another object of the invention to provide a dual band RF cellular phone architecture;

It is another object of the invention to provide such an RF dual band architecture employing the DCS 1800 and GSM frequency bands;

It is another object of the invention to provide a dual band RF cellular phone architecture which adds as little circuit complexity as possible as compared to a single band design;

It is another object of the invention to provide a dual band RF cellular phone architecture which minimizes spurious (unwanted) frequency problems.

According to a first aspect of the invention, a dual band RF architecture is provided including a modulator means for modulating an intermediate frequency (IF). The frequency of the modulated IF signal is changed such that one IF is used for the GSM band and another IF is used for the DCS 1800 band. An intermediate frequency (IF) filter with a pass band that covers both the GSM IF and the DCS 1800 IF is connected to the output of the modulator means and outputs to a transmit phase lock loop. The transmit phase lock loop translates the IF signal from the IF filter to either a DCS 1800 band radio frequency signal or a GSM band radio frequency signal, depending on the frequency of a local oscillator (LO) and whether the GSM transmit VCO or the DSC transmit VCO is active.

According to a second aspect of the invention, the RF architecture employs a down converter for receiving a GSM band signal or a DCS 1800 band signal and for supplying a down converted output signal at an output thereof, the down converted output signal being selected by high side injection for the GSM band and by low side injection for the DCS 1800 band.

According to yet another feature of the invention, the down converter outputs to an intermediate frequency (IF) receiver filter designed to pass either the down converted GSM signal or the down converted DCS signal. A particularly important inventive aspect of the design is that the receiver IF filter is centered at 400 Megahertz (MHz), which contributes to numerous advantages and simplification in the circuitry.

According to yet another aspect of the invention, a single phase lock loop circuit means is used to supply, on a single output, the LO signal for down converting either the GSM receive band or the DCS 1800 receive band, as well as to the transmit phase lock loop. In this manner, a common phase lock loop is used for down conversion in both the transmit and receive paths of the circuitry.

Those skilled in the art will appreciate the considerable number of advantages arising from the architecture of the preferred embodiment. It employs a common IF (Intermediate Frequency) filter for both RX bands, and a single transmit PLL (Phase Locked Loop) for up-converting the phase-modulated IF for both TX bands. The architecture further employs a common IF VCO for both the receive and transmit path. Finally, a common PLL is used for generating the LO (Local Oscillator) signal for the first down-conversion in the receive path and the down-conversion in the PLL of the transmit path. Thus, the frequency plan and other aspects of the RF architecture permits the same IF filters, mixers, VCOs and PLLS to be used regardless of the active band.

The disclosed architecture achieves the goal of adding as little circuitry as possible as compared to a single band design while minimizing effects of unwanted (spurious) frequency components. Thus, the preferred embodiment exhibits superior operational capabilities combined with greatly reduced circuit complexity.

BRIEF DESCRIPTION OF THE DRAWINGS

The exact nature of this invention, as well as its objects and advantages, will become readily apparent upon reference to the following detailed description when considered in conjunction with the accompanying drawings, in which like reference numerals designate like parts throughout the figures thereof, and wherein.

DESCRIPTION OF THE PREFERRED EMBODIMENTS

The following description is provided to enable any person skilled in the art to make and use the invention and sets forth the best modes contemplated by the inventors of carrying out their invention. Various modifications, however, will remain readily apparent to those skilled in the art, since the general principles of the present invention have been defined herein specifically to provide optimal operation and minimal circuit complexity.

Figure 1:
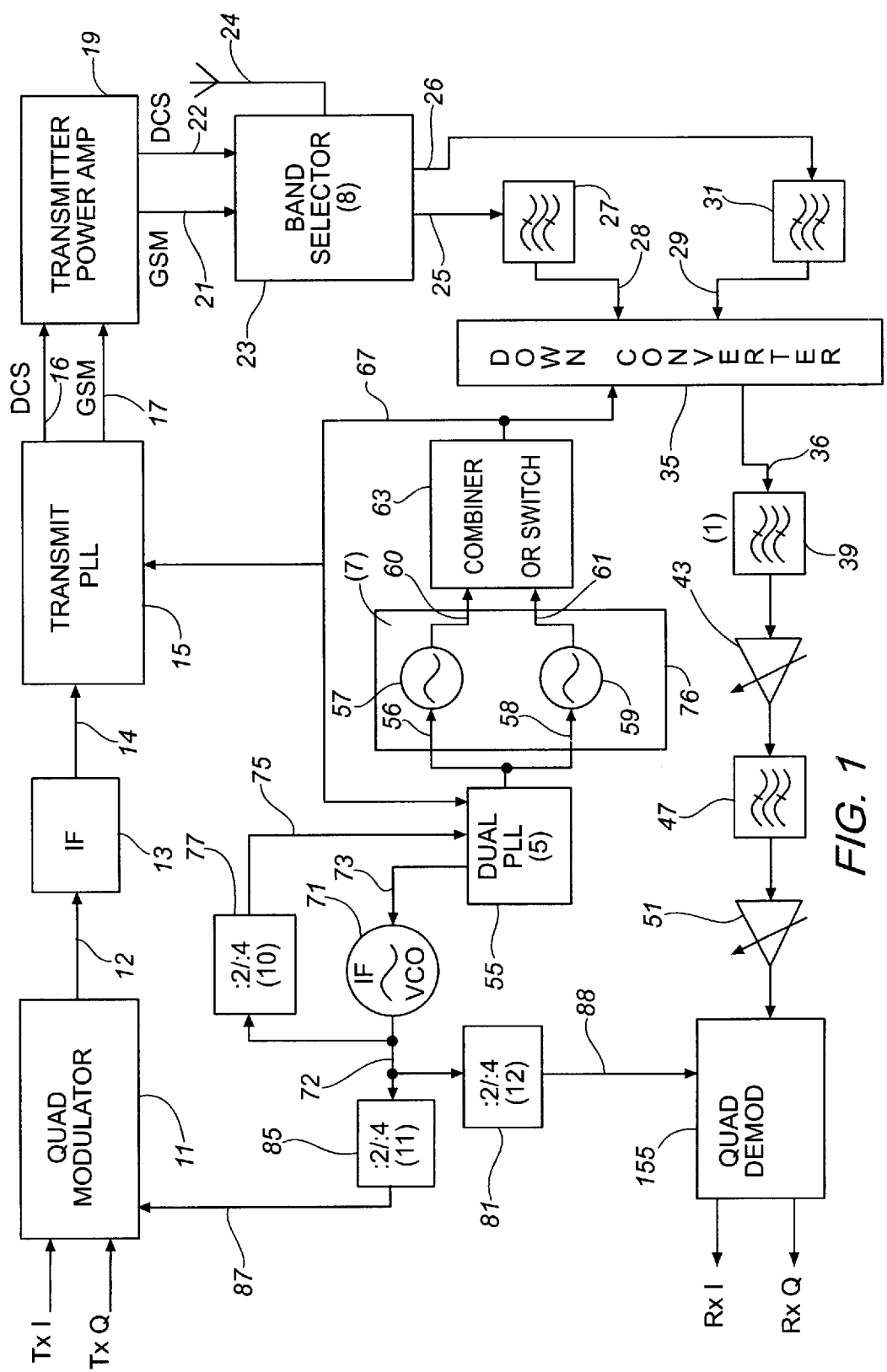
FIG. 1 is a circuit block diagram illustrating the RF Dual band phone architecture of the preferred embodiment.

The preferred embodiment dual-band cellular telephone architecture is illustrated in FIG. 1. The particular embodiment of FIG. 1 is for a GSM/DCS dual-band cellular telephone wherein the transmit frequency bands are 890 to 915 MHz for the GSM band and 1710–1785 MHz for the DCS 1800 band.

In FIG. 1, a quadrature modulator 11 generates a transmit IF frequency signal from the transmit quadrature base band inputs TxI and TxQ. The modulated output signal on line 12 is at a carrier frequency of 394 MHz for the GSM band and 378 MHz for the DCS band. The output on line 12 is supplied to a transmit IF filter 13 centered at 400 MHz. The transmit IF filter 13 in turn outputs a filtered intermediate frequency signal to a transmit phase lock loop (PLL) 15.

The main purpose of the Tx IF filter 13 is to reject harmonics of the IF signal. The filter 13 is a band-pass filter with a pass-band wide enough to pass both the 394 MHz GSM Tx IF signal and the 378 MHz DCS 1800 Tx IF signal with little attenuation. A secondary function of the Tx IF filter is to limit the wide-band noise to the input of the transmit PLL.

In the DCS mode, the transmit PLL 15 produces an output signal on line 16 in the DCS frequency band, while in the GSM mode, the transmit PLL 15 produces an output signal on line 17 in the GSM frequency band. The signal lines 16 and 17 are supplied to a power amplifier circuit 19, which in turn provides respective DCS and GSM output signals to a band selector 23. The band selector 23 determines which frequency band is output to the antenna 24. The band selector 23 includes a band diplex filter, such as Murata Part No. FKN0106A.

The function of the diplex filter in the band selector 23 is to combine the two bands at the output of the filter. The diplex filter is in principle a low-pass filter (for the GSM band) and a high-pass filter (for the DCS 1800 band) with the outputs combined into a single output. In addition to combining the bands, the diplex filter also provides isolation from the DCS 1800 power amplifier output to the GSM power amplifier output and vice versa. Also, since a low-pass filter constitutes the GSM path of the diplex filter, harmonic attenuation of the GSM transmitter is provided. There need not be a diplex filter in the band selector 23. The same function can be achieved by a combination of switches and filters.

On the receive side, the band selector 23 outputs either a received DCS signal or a received GSM signal on respective signal lines 25, 26 to respective filters 27, 31. The front end filters 27, 31 have pass bands of 935 to 960 MHz and 1805 to 1880 MHz, respectively, and output over respective signal lines 28, 29 to a down converter 35. The down converter 35 down converts the received RF frequency signal to an intermediate (IF) frequency signal which is supplied on signal line 36 to an IF filter 39.

The IF filter 39 is a SAW band pass filter centered at 400 MHz. The Rx IF filter has a 3 dB bandwidth of about 200 kHz (the channel bandwidth in the GSM system) and a center frequency of 400 MHz. This filter 39 provides the selectivity of the receiver, and attenuates neighboring channels and other unwanted signals.

The output of the IF filter 39 is supplied to a first IF programmable gain amplifier 43, which outputs to a filter 47 which in turn outputs to a second IF programmable gain amplifier 51. The filter 47 limits the bandwidth of the amplifier chain 43, 51 to avoid oscillation caused by unwanted feedback and may comprise a simple LC tank. The output of the second amplifier 51 is supplied to a quadrature demodulator circuit 155 which down converts the received IF signal to a complex base band output signal Rx I, Rx Q.

Various functional units of the circuit of FIG. 1 are supplied with required operating frequencies by frequency generating circuitry including a dual phase lock loop 55. The phase lock loop 55 outputs over a signal line 56 to a first VCO 57 and over a signal line 58 to a second VCO 59. The first VCO 57 operates in the GSM mode and its range is 1284 to 1350 MHz. The second VCO 59 operates in the DCS mode and its range is 1332 to 1480 MHz. The VCOs 57, 59 output over respective signal lines 60, 61 to a combiner or switch 63. The switch 63 selects the appropriate output 60 or 61 and causes it to appear on signal line 67 as a local oscillator (LO) frequency. This LO frequency on line 67 is supplied to the down converter 35, the transmit PLL 15, and the dual PLL 55. The two VCO's 57 and 59 can be replaced by a single VCO covering the total range 1284 MHz to 1480 MHz, or a switch VCO with a control input determining whether the output covers the GSM range or the DCS 1800 range.

The dual PLL 55 further provides a signal output on line 73 to an IF VCO 71, which comprises a common IF VCO for both the transmit and receive paths. The dual PLL comprises two conventional PLLs locked to the same reference (not shown). The output signal of the IF VCO 71 on signal line 72 is supplied to a PLL feedback path divider 77, a receive path divider 81, and a transmit path divider 85. The output of the PLL feedback path divider 77 is supplied over signal line 75 to the dual PLL 55. The output of the transmit path divider 85 is supplied over a signal line 87 to the quadrature modulator 11, and the output of the receive path divider 81 is supplied over signal line 88 to the quadrature demodulator 155. The IF VCO 71 operates at double the LO frequency and provides output signals on line 72 at 783 MHz for the transmit GSM, 756 MHz for the transmit DCS, and 800 MHz for the demodulator 155.

The IF VCO 71 is tunable to cover the range 756 MHz to 800 MHz. Because the GSM system is a TDMA (time division multiple access) system, the phone is not receiving and transmitting at the same time and there is time between the receive and transmit burst to lock the VCO 71 to the desired frequency (by means of the PLL).

Figure 2:
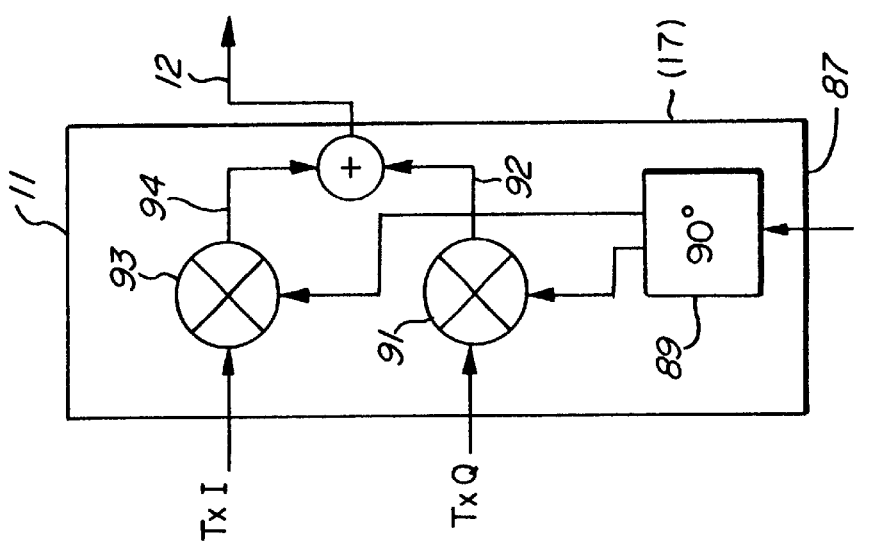
FIG. 2 is a circuit block diagram of a modulator employable in the architecture of FIG. 1.

FIG. 2 illustrates the quadrature modulator 11 in more detail. The modulator 11 preferably employs Gaussian minimum shift-keying (GMSK) and includes a 90 degree phase shift circuit 89, and first and second modulators or mixers 91, 93. In GSM mode, a 394 MHz IF LO signal is input to the phase shifter 89, while in DCS mode, a 378 MHz IF LO signal is input to the phase shifter 89. One of the multipliers 91, 93 is supplied with a zero degree phase shifted IF LO signal, and the second of the multipliers 91, 93 is supplied with an IF LO signal shifted in phase by 90 degrees. The outputs 92, 94 of the modulators 92, 94 are combined by a combiner 95 and appear on output line 12 to the transmit PLL 15.

Figure 3:
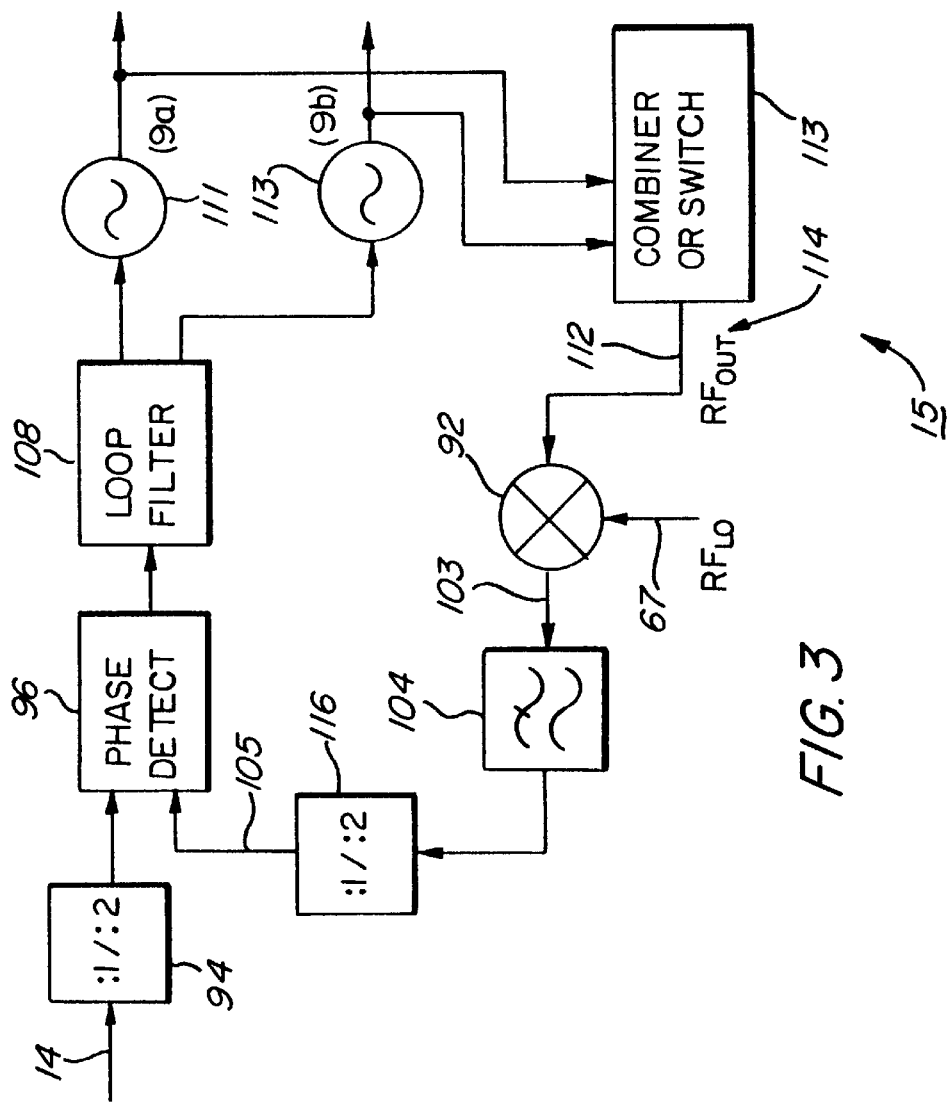
FIG. 3 is a circuit block diagram illustrating a transmit phase lock loop circuit employable in the architecture of FIG. 1.

A suitable transmit circuit 15 employing first and second VCO's is shown in FIG. 3. The circuit of FIG. 3 provides the DCS band transmit frequency at the output of the VCO 111 and the GSM band transmit frequency at the output of the VCO 113. Alternatively, the transmit PLL 15 may be constructed to employ a single VCO to supply both the DCS and GSM band transmit frequencies as taught in the copending application by the inventors hereof entitled Modulation Technique For Multi-band Applications, filed Mar. 19, 1998, U.S. Ser. No. 09/044,281, incorporated by reference herein.

In the circuit of FIG. 3, a phase modulated intermediate input frequency (IF) on line 14 is input to a first divider 94 of the PLL circuit 15. The output of the divider 14 is then input into a phase detector 96. The phase detector 96 outputs a voltage that is proportional to a phase difference between its two input frequencies. This phase detector output voltage is then input into a loop filter 108. The loop filter 108 smoothes the phase detector output voltage and determines the loop performance based upon selected loop filter values. When the phone is in transmit mode, only one of the two transmit VCO 111, 113 is active. Thus, the output of the loop filter 108 adjusts the active transmit VCO's 111 or 113 and determines its output frequency.

The feedback loop 114 of the PLL 15 contains a mixer 92 which mixes a local oscillator signal $RF_{LO}$ on line 67 with the $RF_{OUT}$ signal on signal line 112. The output of the mixer 92 is input into a bandpass (BP) filter 96. The output of the mixer 104 may be referred to as the "feedback frequency." The selected outputs of the mixer 106 are either $RF_{OUT}$-$RF_{LO}$ or $RF_{LO}$-$RF_{OUT}$ (assuming frequency down-conversion). The bandpass filter 104 removes any unwanted mixing products produced by the mixer 92 and determines which frequency is fed-back through the divider 116.

The PLL circuit 15 operates to translate (ie., move) the frequency of the input IF frequency on signal line 14 to the VCO frequency with the same phase. Thus, by adjusting the value of the $RF_{LO}$ frequency 26, a desired output frequency $RF_{OUT}$ is produced for a given intermediate frequency (IF) on line 14. As will be appreciated, the first PLL VCO 111 outputs a signal having a frequency in the DCS transmit band (1710–1785 MHz) while the second PLL VCO outputs a signal of frequency in the GSM transmit band (890–915 MHz). In transmit mode, the $R_{OUT}$ frequency of the active transmit VCO 111 or 113 is fed back via the feedback loop 114 and the combiner or switch 113. Frequencies in MHz for the transmit mode at various points in the circuit of FIG. 3 are:

|  | DCS | GSM |
|---|---|---|
| LO (line 67): | 1332–1407 | 1284–1309 |
| signal line 103 | 378 | 394 |
| signal line 105 | 189 | 197 |

Figure 4:
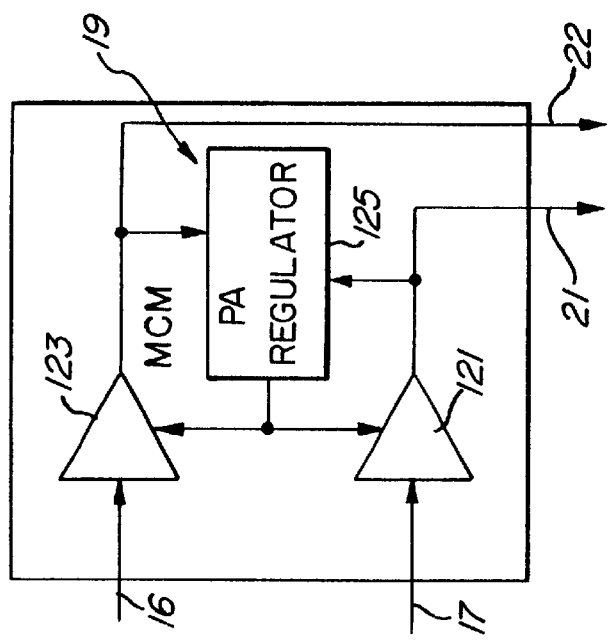
FIG. 4 is a circuit diagram of a power amplifier circuit employable in the architecture of FIG. 1.

As shown in FIG. 4, the transmit output RF signals on respective signal lines 16, 17 from the transmit PLL 15 are supplied to respective RF power amplifiers 121, 123 of the transmit power amplifier circuit 19. The outputs of RF amplifiers 121, 123 are regulated by a power amplifier regulator 125 and their respective regulated outputs appear on the signal lines 21, 22 provided to the band selector 23. In alternate embodiments, a single power amplifier could be employed with a band selector switch on its input. Various other known arrangements of power amplifier circuitry may also be employed.

Figure 5:
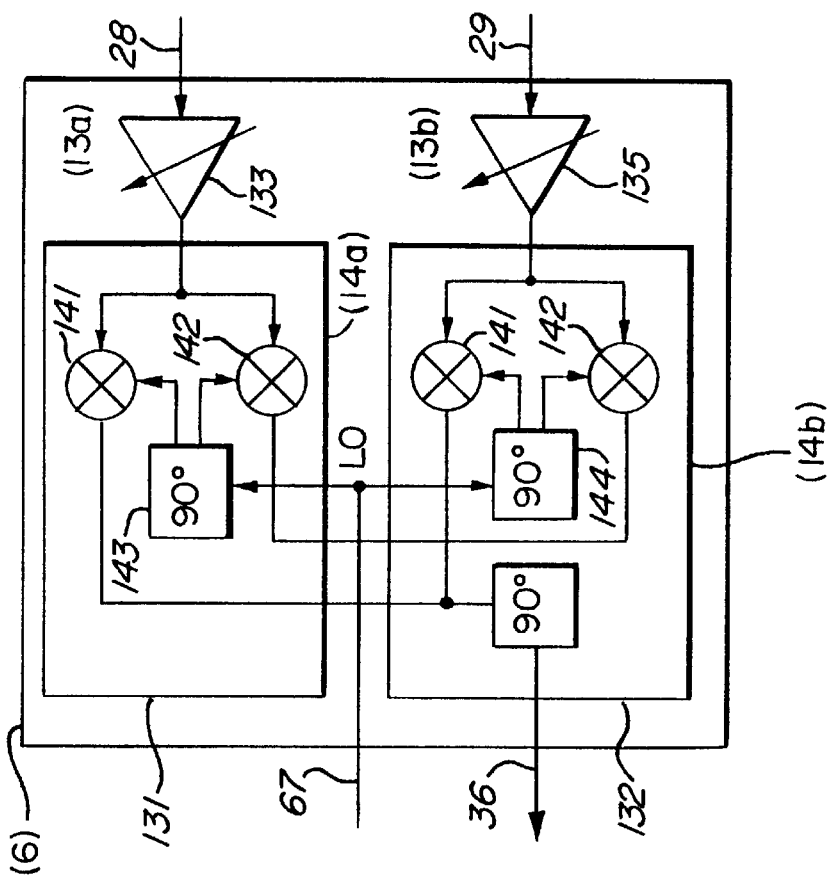
FIG. 5 is a circuit diagram of down-converter circuitry employable in the architecture of FIG. 1.
Figure 6:
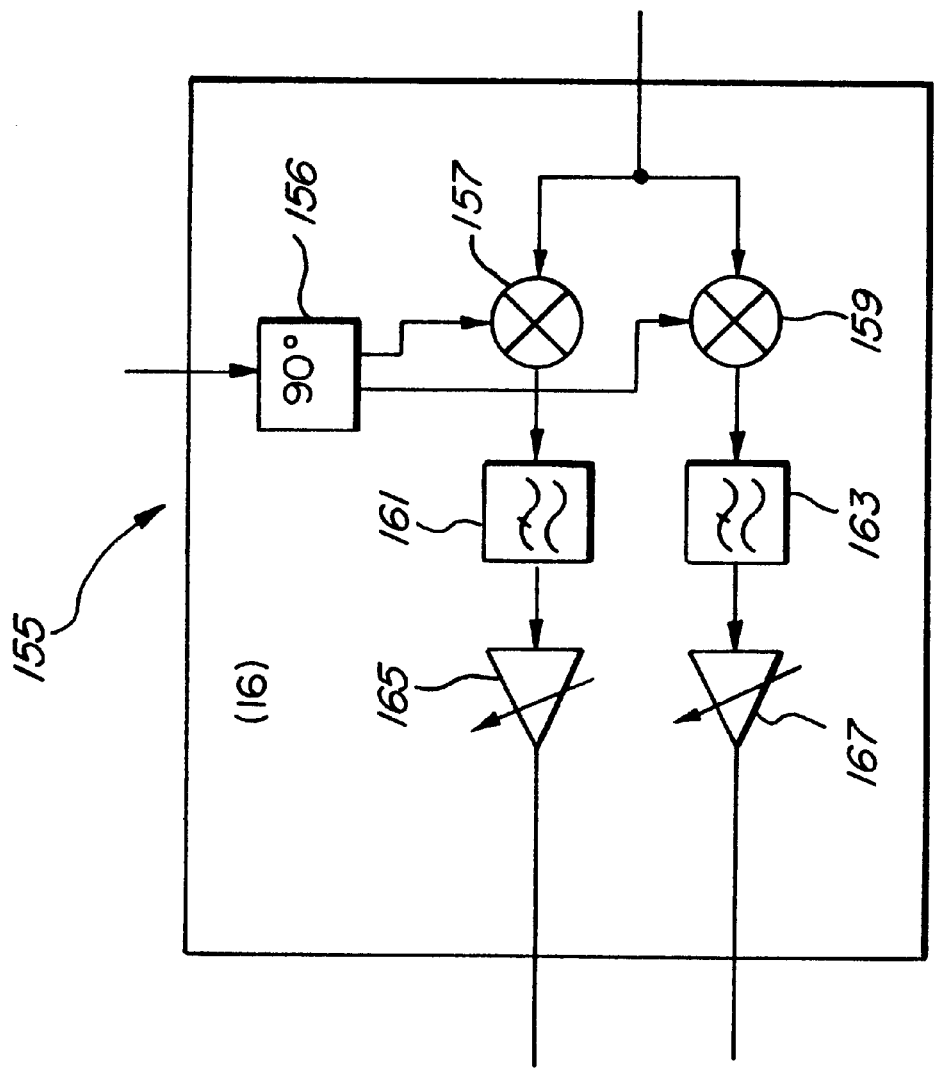
FIG. 6 is a circuit diagram of a demodulator employable in the architecture of FIG. 1.

The down converter 35 is illustrated in more detail in FIG. 5. The particular circuit shown contains a respective single side band (SSB) image reject mixer circuit 131, 132 and a respective low noise amplifier (LNA) 133, 135 for each band with input from the respective signal lines 28, 29. Each image reject mixer 131, 133 is illustrated as containing first and second mixers 141, 142 with appropriate local oscillator (LO) signals being supplied as second inputs after appropriate phase shifts by phase shift blocks 143, 144. The Rx LO frequencies are in the range of 1335 to 1360 MHz for the GSM mode and 1405 to 1480 MHz for the DCS mode. Various other arrangements of mixers and LNA's may be used to achieve the same results, as those skilled in the art aided by this disclosure will appreciate. The down converter 35 outputs to a conventional quadrature demodulator 155 which, as shown in FIG. 6, may include a 90° phase shift circuit 156, first and second mixers 157, 159, first and second filters 161, 163 and first and second amplifiers 165, 167.

A general problem with heterodyne receivers (i.e., receivers that use down conversion) is the suppression of the so-called image frequency. In such receivers, the IF frequency signal is generated by mixing the received RF (Radio Frequency) signal with a LO signal, with frequency $f_{LO}$ given by:

| and | $f_{LO} = f_{RF} + f_{IF}$ | (for high side injection) |
|---|---|---|
| | $f_{LO} = f_{RF} - f_{IF}$ | (for low side injection) |
| where | $f_{RF}$ is the frequency of the wanted RF signal | |
| and | $f_{IF}$ is the frequency of the IF signal | |

In the case of, for example, high side injection, the frequency of the wanted RF signal is:

$f_{RF} = f_{LO} - f_{IF}$                   (for high side injection)

but an unwanted signal at frequency $f_{LO}+f_{IF}$ will be down converted to the IF as well (by low side injection). This unwanted signal is called the image frequency. Thus, signals at the image frequency must be attenuated before reaching the IF stage of the receiver.

One important characteristic of the preferred architecture is that the LO used for RX down conversion and the down conversion in the transmit PLL is "high side injection" for the GSM band and "low side injection" for the DCS 1800 band. The image frequency for the DCS mode in the preferred embodiment thus lies in the range 1005 to 1080 MHz, while the image frequency for the GSM mode lies within the range 1735 to 1760 MHz (1725–1760 MHz for EGSM). With a 400 MHz IF filter, the image filtering needed can be easily obtained. As noted above, the band-selector 23 contains a band diplex filter. This filter can have 20 dB or more attenuation of both the GSM and DCS 1800 image frequencies with a 400 MHz IF. The RX IF could range from 378 to 410 MHz, keeping in mind that as the RX IF gets lower, the LO range gets wider.

Alternately, the front end circuitry of the receiver may be constructed in accordance with the disclosure of copending U.S. patent application Ser. No. 09/036,258 by John B. Rowland, Jr., filed Mar. 6, 1998, and assigned to the assignee hereof. According to such disclosure, a high pass elliptical filter and SAW filter (31) are used for image rejection on the DCS channel 26 and a single SAW filter (27) is used for image rejection on the GSM channel 25.

Another important characteristic of the preferred architecture is that the frequency tuning range of the main LO 76 is chosen so that one oscillator with a switching tank circuit can cover its function (shown as two individual VCO's 57, 59 on FIG. 1) to save space and cost. The LO 76 could also be a non-switching type. The total frequency range of the preferred LO 76 is 1284 to 1480 MHz (169 MHz).

Furthermore, as noted above, the IF VCO 71 is set to run at the double LO frequency and then is divided by the internal dividers 85, 81, 77 for both the TX path 97, the RX path 88 and the PLL feedback path 75. This arrangement reduces unwanted feedback to the IF VCO 71. The unwanted feedback in the case of no dividers would be:

1) from the modulated IF 12, 14 to the IF VCO 71, which would then be running at the same frequency, but not modulated; and
2) from the IF VCO 71 to the Rx IF 36, which also would be at the same frequency.

In the preferred embodiment, the output signal frequencies on the respective paths 87, 88, 75 are as follows (in MHz):

|    | GSM Rx | GSM Tx | DCS 1800 Rx | DCS 1800 Tx |
|----|--------|--------|-------------|-------------|
| 87 | (not active) | 394 MHz | (not active) | 378 MHz |
| 88 | 400 MHz | (not active) | 400 MHz | (not active) |
| 75 | 400 MHz | 394 MHz | 400 MHz | 378 MHz |

It will be appreciated that the phone has five active modes: GSM Tx, GSM Rx, DCS 1800 Tx, DCS 1800 Rx and transition mode (transition mode being when the phone is changing between the four other active modes). In addition to the active modes, the phone can be in idle mode of power down. A system microcontroller preferably controls and sequences switching functions necessary to transition from one mode to another.

It will be observed that the frequencies employed in the preferred embodiment minimize spurious problems:

The 400 MHz Rx IF avoids low order Rx spurs (lowest orders is 3-by-4 for DCS 1800 and 3-by-6 for GSM).

Harmonics of the 400 MHz Rx LO falls outside the RX bands.

No harmonics of the 13 MHz GSM system clock is within a channel-BW distance from the Rx IF.

The high RX IF of 400 MHz makes image-filtering in the front-end relatively easy.

The Tx IF's have no harmonics in the active Tx or Rx band:

| GSM (Tx IF = 197 MHz): | 4th: | 788 MHz |
|---|---|---|
| | 5th: | 985 MHz |
| DCS 1800 (Tx IF = 189 MHz): | 9th: | 1701 MHz |
| | 10th: | 1890 MHz |

The zero-crossing spurs in the active Tx band are of high order. The lowest order zero crossing spur for GSM is 5-by-33. For DCS 1800, it is 3-by-22.

Those skilled in the art will appreciate the considerable number of advantages arising from the architecture of the preferred embodiment. It employs a common IF (Intermediate Frequency) filter for both RX bands, and a single transmit PLL (Phase Locked Loop) for up-converting the phase-modulated IF for both TX bands. The architecture further employs a common IF VCO for both the receive and transmit path. Finally, a common PLL is used for generating the LO (Local Oscillator) signal 67 for the first down-conversion in the receive path and the down-conversion in the PLL 15 of the transmit path. Thus, the preferred embodiment exhibits superior operational capabilities combined with greatly reduced circuit complexity.

Those skilled in the art will additionally appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. An RF dual band phone circuit operating in the DCS 1800 and GSM frequency bands, comprising:

a modulator for producing an output comprising a pair of baseband signals (I and Q) modulating a first intermediate frequency (IF) signal for the GSM band or a second intermediate frequency (IF) signal for the DCS 1800 band;

a receive phase lock loop for generating a high side injection local oscillator signal for the GSM band and a low side injection local oscillator signal for the DCS 1800 band;

a transmit phase lock loop for translating the first IF signal to a GSM band radio frequency signal or the second IF signal to a DCS 1800 band radio frequency signal, depending on which one of the two local oscillator signals is supplied to it, the GSM band signal or the DCS 1800 band signal being down converted and fed back to the IF input of the transmit phase lock loop; and an amplifier for amplifying the output of the transmit phase lock loop and for supplying the amplified signal to an antenna.

2. The circuit of claim 1 further including a down converter connected to the receive phase lock loop for receiving one of a GSM band signal and a DCS 1800 band signal and for down converting the received GSM band signal with the high side injection local oscillator signal and the received DCS 1800 band signal with the low side injection local oscillator signal.

3. The circuit of claim 2 further including an intermediate frequency (IF) receiver filter centered at 400 MHz having an input connected to the output of the down converter.

4. The circuit of claim 2 wherein the high and low side injection local oscillator signal lie within a frequency range of 1284 MHz to 1480 MHz.

5. The circuit of claim 3 further including a filter positioned before the down converter for providing at least 20 db attenuation of the GMS and DCS image frequencies.

6. The circuit of claim 1 wherein the first IF frequency is 394 MHz and the second IF frequency is 378 MHz.

7. The circuit of claim 1 wherein the receive phase lock loop includes a single voltage controlled oscillator for generating both local oscillator signals.

8. The circuit of claim 7 wherein both local oscillator signals lie within a frequency range of 1284 MHz to 1480 MHz.

9. The circuit of claim 1 wherein the transmit phase lock loop includes a mixer for mixing the GMS band radio frequency signal with the high side injection local oscillator signal and the DCS 1800 radio frequency band signal with the low side injection local oscillator signal, and a bandpass filter for removing unwanted mixing products form the mixer output.

10. The circuit of claim 9, wherein the transmit phase lock loop includes a first frequency divider for dividing the frequency of one of the first and second IF signal and a second frequency divider for dividing the frequency of the bandpass filter output signal, and a phase detector for comparing the phases of the frequency divided signals.

11. The circuit of claim 10, wherein the first and second frequency divider divide the frequency by 2.

12. The circuit of claim 1 further comprising a single IF VCO, and a frequency divider connected to the output of the IF VCO for generating an IF frequency signal for the modulator.

13. An RF dual band phone circuit operating in the DCS 1800 and GSM frequency bands comprising:
    a modulator for producing an output comprising a pair of baseband signals (I and Q) modulating a first intermediate frequency (IF) signal for the GSM band or a second intermediate frequency (IF) signal for the DCS 1800 band;
    an intermediate frequency (IF) filter having an input and an output, the input of the filter being connected to the output of the modulator;
    a transmit phase lock loop connected to the output of the IF filter for translating the filtered first IF signal to a GSM band radio frequency signal or the filtered second IF signal to a DCS 1800 band radio frequency signal, depending on which one of a first and second local oscillator signal is supplied to it the GSM band signal or the DCS 1800 band signal being down converted and fed back, to the IF input of the transmit phase lock loop;
    an amplifier for amplifying the output of the transmit phase lock loop;
    a down converter for receiving one of a GSM band signal and a DCS 1800 band signal and for supplying a down converted output signal, said output signal being selected by high injection for the GSM band and low side injection for the DCS 1800 band; and
    a local oscillator (LO) phase lock loop for supplying, on a single output, either the first LO frequency signal or the second LO frequency signal to the down converter and to the transmit phase lock loop for effecting a down conversion in the transmit phase lock loop of the GSM band or DCS 1800 band radio frequency signal, whereby a common phase lock loop is used for down conversion in both the transmit and receive paths of the circuit.

14. The circuit of claim 13 further including
    a single IF VCO, and
    frequency divider means connected to the output of the IF VCO for generating an IF frequency signal for the modulator, and an IF frequency for a demodulator.

15. The circuit of claim 14 further including
    an intermediate frequency (IF) filter centered at 400 MHz having an input connected to the output of the down converter.

16. The circuitry of claim 1 wherein said intermediate frequency filter is a IF frequencies.

17. The circuit of claim 14, wherein the single IF VCO is tunable over a frequency range of 756 MHz to 800 MHz.

18. The circuit of claim 17 wherein the first phase lock loop further includes a single voltage controlled oscillator having a frequency range of 1284 MHz to 1480 MHz for generating both the high and low side injection local oscillator signal.

19. A method for generating a dual band RF output in an RE dual band phone operating in the DCS 1800 and GSM frequency band, the steps of the method comprising:
    modulating a first intermediate frequency (IF) signal for the GSM band on a second intermediate frequency (IF) signal for the DCS 1800 band with a pair of baseband signals (I and Q);
    generating a high side injection local oscillator signal for the GSM band and a low side injection local oscillator signal for the DCS 1800 band;
    translating the first IF signal to a GSM band radio frequency signal using the high side injection local oscillator signal;
    translating the second IF signal to a DCS 1800 band radio frequency signal using the low side injection local oscillator signal; and
    down converting the GSM band signal or the DCS 1800 signal and feeding it back to the IF signal translating steps as part of a phase lock loop.

* * * * *